United States Patent
Angelopoulos et al.

(10) Patent No.: US 6,514,667 B2
(45) Date of Patent: Feb. 4, 2003

(54) TUNABLE VAPOR DEPOSITED MATERIALS AS ANTIREFLECTIVE COATINGS, HARDMASKS AND AS COMBINED ANTIREFLECTIVE COATING/HARDMASKS AND METHODS OF FABRICATION THEREOF AND APPLICATIONS THEREOF

(75) Inventors: Marie Angelopoulos, Cortlandt, NY (US); Katherina Babich, Chappaqua, NY (US); Alfred Grill, White Plains, NY (US); Scott David Halle, Hopewell Junction, NY (US); Arpan Pravin Mahorowala, White Plains, NY (US); Vishnubhai Vitthalbhai Patel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/932,002

(22) Filed: Aug. 17, 2001

(65) Prior Publication Data

US 2002/0012876 A1 Jan. 31, 2002

Related U.S. Application Data (62) Division of application No. 09/480,442, filed on Jan. 10, 2000, now Pat. No. 6,316,167, which is a continuation-in-part of application No. 09/603,257, filed on Jun. 23, 2000, which is a division of application No. 09/107,567, filed on Jun. 29, 1998, now Pat. No. 6,147,009.

(51) Int. Cl.$^7$ .......................... G03F 7/075; H01L 21/31; C23C 16/00
(52) U.S. Cl. ................. 430/271.1; 430/272.1; 430/313; 430/325; 430/5; 438/712; 438/780; 438/789; 427/248.1; 427/255.6
(58) Field of Search .......................... 430/272.1, 270.1, 430/325, 313, 780; 438/789, 712; 427/248.1, 255.6

(56) References Cited

U.S. PATENT DOCUMENTS

| | | | | | |
|---|---|---|---|---|---|
| 4,237,208 | A | * | 12/1980 | Desai et al. ................. | 430/270 |
| 6,147,009 | A | * | 11/2000 | Grill et al. ................... | 438/780 |
| 6,303,266 | B1 | * | 10/2001 | Okino et al. ............. | 430/270.1 |

* cited by examiner

*Primary Examiner*—Rosemary Ashton
(74) *Attorney, Agent, or Firm*—Daniel P. Morris

(57) ABSTRACT

A lithographic structure and method of fabrication and use thereof having a plurality of layers at least one of which is a an RCHX layer which comprises a material having structural formula R:C:H:X, wherein R is selected from the group consisting of Si, Ge, B, Sn, Fe, Ti and combinations thereof and wherein X is not present or is selected from the group consisting of one or more of O, N, S, and F and a layer of an energy active material. The RCHX layers are useful as hardmask layers, anti-reflection layers and hardmask anti-reflection layers. The RCHX layer can be vapor-deposited and patterned by patterning the energy active material and transferring the pattern to the RCHX layer.

21 Claims, 10 Drawing Sheets

TUNABLE VAPOR DEPOSITED MATERIALS AS ANTIREFLECTIVE COATINGS, HARDMASKS AND AS COMBINED ANTIREFLECTIVE COATING/HARDMASKS AND METHODS OF FABRICATION THEREOF AND APPLICATIONS THEREOF

This is a division of application Ser. No. 09/480,442, filed Jan. 10, 2000, U.S. Pat. No. 6,316,167, which is a continuation-in-part of Ser. No. 09/603,257 filed Jun. 23, 2000, which is a division of 09/107,567 filed Jun. 29, 1998, now U.S. Pat. No. 6,147,009.

FIELD OF THE INVENTION

The present invention is directed to structures and methods useful for fabricating integrated circuits (IC), in particular structures having a plurality of layers. More particularly, the present invention is directed to tunable vapor deposited silicon, germanium, boron, tin, iron or, titanium and combinations thereof containing materials which function as antireflective coatings, as hardmasks and as combined antireflective coating/hardmasks for high resolution lithography. These materials and structures thereof can be applied to optical lithography (248 nm, 193 nm, 157, 126 nm), extreme ultraviolet lithography (EUV), electron beam (e-beam) lithography, ion beam and x-ray lithography.

BACKGROUND OF THE INVENTION

The need to remain cost and performance competitive in the production of semiconductor devices has driven the industry to a continuing increase in device density with a concomittant decrease in device geometry. To facilitate the shrinking device dimensions, new lithographic materials, processes and tools are being considered. Currently, 248 nm lithography is being pursued to print sub-200 nm features. To do this, tools with higher numerical aperture (NA) are emerging. The higher NA allows for improved resolution but reduces the depth of focus of aerial images projected onto the resist. Because of the reduced depth of focus, a thinner resist will be required. As the thickness of the resist is decreased, the resist becomes less effective as a mask for subsequent dry etch image transfer to the underlying substrate, i.e. most if not all of the resist is etched away during the subsequent pattern transfer process. Without significant improvement in the etch selectivity exhibited by current single layer resists (SLR), these systems can not provide the necessary lithographic and etch properties for high resolution lithography.

Another problem with single layer resist systems is critical dimension (CD) control. Substrate reflections at ultraviolet (UV) and deep ultraviolet (DUV) wavelengths are notorious to produce standing wave effects and resist notching which severely limit CD control of single layer resists. Notching results from substrate topography and nonuniform substrate reflectivity which causes local variations in exposure energy on the resist. Standing waves are thin film interference (TFI) or periodic variations of light intensity through the resist thickness. These light variations are introduced because planarization of the resist presents different thickness through the underlying topography. Thin film interference plays a dominant role in CD control of single layer photoresist processes, causing large changes in the effective exposure dose due to a tiny change in optical phase. Thin film interference effects are described in "Optimization of optical properties of resist processes" (T. Brunner, SPIE Proceedings Vol. 1466, p. 297, 1991), the teaching of which is incorporated herein by reference.

Bottom anti-reflective coatings or BARCs have been used with single layer resists to reduce thin film interference. However, these thin absorbing BARCs have fundamental limitations. These materials are generally spin applied. The thickness of the BARC and the resist can not be controlled to the accuracy required to operate at the target thickness to achieve minimum reflectance. The resist thickness may also vary due to existing topography. Thin underlying films such as silicon nitride or silicon oxide tend to exhibit some thickness nonuniformity after deposition. The thin BARC will generally not effectively planarize this thin underlying films. Thus, as a result there will be a variation in exposure energy into the resist. Current trends to reduce topography via chemical/mechanical polishing still leave significant variations in film thickness over topography.

Figure 1A:
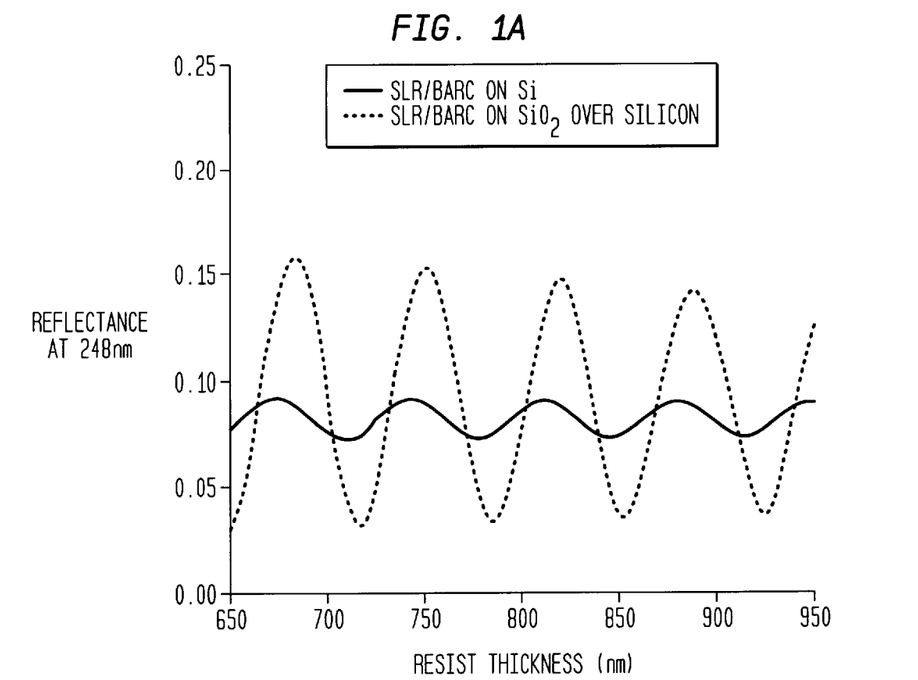

Vapor deposited, such as plasma enhanced chemical vapor deposited (PECVD) BARCs, are currently being investigated. We consider an example with a carbon ARC deposited by PECVD process. FIG. 1 represents a swing curve comparison of BARC/single layer resist process (a) and a RCHX ARC/Hardmask process (b) in which a thin resist on the order of 3400A is applied on top of a thick RCHX hardmask layer (swing curve is a plot of reflectance versus resist thickness. Swing ratio is defined as the ratio of peak to valley change to the average value in the swing curve). In the R:C:H:X formula R is selected from Si, Ge,B, Sn, Fe, Ti and mixtures of these elements and X is selected from O, N, S, F and mixtures of these elements and X is optionally present. The results in FIG. 1 are obtained by simulations on two substrates, silicon and $SiO_2$. Reflectance at 248 nm as a function of resist thickness is computed at the resist/air interface. The simulated structure of the single layer resist (FIG. 1a solid line) includes a Si substrate, 900A thick bottom ARC with n=1.9 and k=0.42 at 248 nm and photoresist with n=1.8 and k=0.02 at 248 nm. The optical constants of the bottom ARC are typical of PECVD ARCs. FIG. 1a shows that by using 900A thick bottom ARC with n=1.9 and k=0.42 about 2% swing ratio can be achieved on a silicon substrate.

Figure 1B:
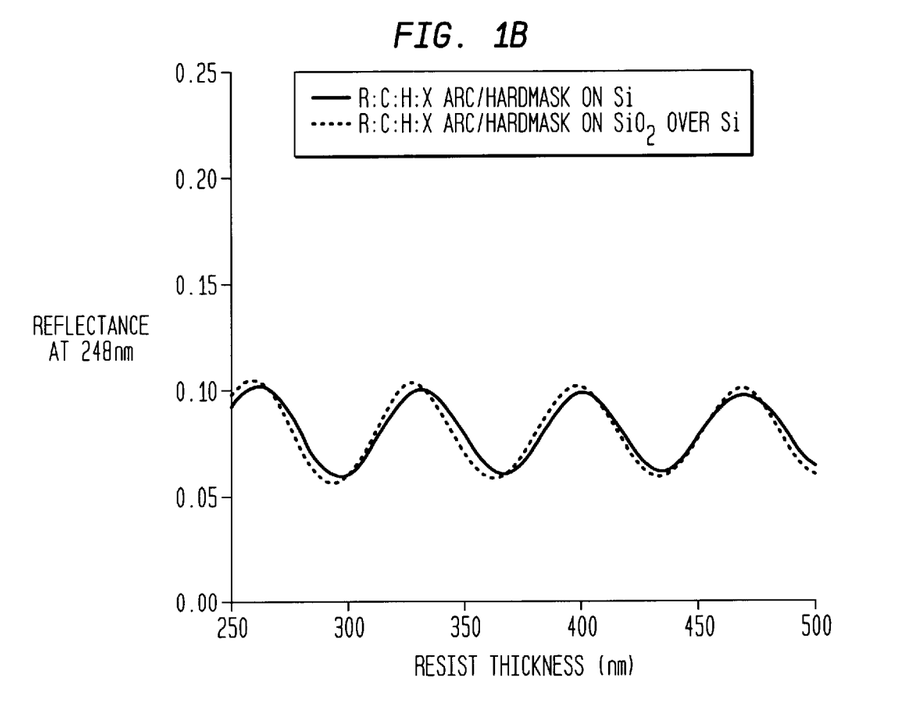

Similarly, a simulated bilayer structure on silicon and on a SiO2 layer is shown in FIG. 1b. This structure includes a Si substrate, a 4100A thick RCHX ARC-hard mask layer with n=1.78 and k=0.22 at 248 nm and a thin DUV resist with n=1.78 and k=0.01 at 248 nm. Swing ratio of less than 4% similar to the thin ARC process was obtained for the ARC-hard mask structure on a Si substrate (FIG. 1b solid line). To demonstrate the dependence of the ARC on underlying topography, 500A of SiO2 was deposited on the silicon substrate (FIG. 1a and FIG. 1b dotted lines). As can be seen in FIG. 1a, the single layer resist structure is very dependent on the underlying substrate reflectivity and topography, whereas, the hardmask/thin resist structure was independent of underlying topography. A large variation in reflectance, about 18% swing ratio, which directly translates to CD variation was observed for the SLR structure with an oxide underlayer (FIG. 1a dotted line). This reflection variation directly corresponds to CD variation, and it's about 18% as a function of the resist thickness and does not meet +/−10% linewidth control criterion even on single layer substrate. In contrast, almost no reflectance variation was observed for hardmask thin resist (FIG. 1b dotted line). Swing ratio of less than 4% was obtained for the simulated hardmask thin resist structure independently from the underlying substrate reflectivity. The entire range of the data easily fits within the +/−10% linewidth control criterion. So from an optical point of view, thick ARC-hard mask structure appeared to be more beneficial compared to SLR structure.

Plasma etching is used to transfer the sub-0.25 micron features developed in the SLR into the underlying oxide, nitride or polysilicon layers. Before the pattern is transferred to the underlying substrate, it must first be transferred through the BARC which is used to reduce thin film interference. A typical etch chemistry for the BARC open is composed of N2/O2/Fluorocarbon plasma. The etch selectivity between resist and BARC are at best 1:1. Assuming a 900 A thick BARC layer, this translates to a SLR loss of 900 A. Thus, significant resist loss occurs during the BARC open.

The combined SLR plus BARC system must stand as a mask for the subsequent underlayer etch. Small etch rates, minimal profile distortion (e.g. faceting) and little resist surface microroughening are desirable attributes for the mask material. Moreover, during the BARC open, SLRs develop striations which translate down into the underlayer and appear as "scallops". Scalloping or microcrevasing of the underlying oxide, nitride or Si materials cause undesirable effects e.g. degrades resolution of contacts and distorts device performance, lowers charge carrier mobilities due to scattering.

To attain best lithographic performance, it is desirable to thin the resist as much as possible. This allows better resolution to be attained and provides better process window in particular depth of focus. A thin resist, however, does not provide the etch performance needed for the transfer of the resist pattern into the underlying substrate. Significant resist loss occurs during the BARC open as well as striations and surface roughening. This problem becomes more serious when the starting resist thickness is small. Thus, current SLR resists with BARC does not provide an integrated lithography/etch solution for advanced lithography.

To overcome some of the limitations of single layer resists, thin film imaging techniques have been developed including bilayer resists, trilayer resist systems and top surface imaging (TSI). In a bilayer structure, a thin resist containing Si functionality for etch resistance is coated on top of a thick polymer layer with suitable absorption at the exposing wavelength to act as a BARC and suitable etch resistance for substrate etch. Because of the thick resist/underlayer stack, this technique offer tremendous advantage for etch transfer. However, incorporation of Si moieties into the imaging resist structure is very challenging and can result in limited resolution and low performance of such resist systems. All of these thin film imaging techniques are more complex and costly than current single layer resist processes.

It is desirable to develop a thin resist process which provides excellent lithographic performance and provides appropriate etch resistance for effective pattern transfer into the underlying substrate. In order to do this, improved BARCs are needed which provide better etch selectivity to resist than current organic BARCs. The BARCs need to (1) have appropriate optical properties to function as a suitable ARC at appropriate wavelength (2) provides good etch selectivity to resist (greater than 1:1) and (3) does not interact with the resist inducing residue, footing, undercut thereby limiting the overall lithographic performance of the resist. It is also desirable that the BARC also function as a suitable hard mask material for the underlayer oxide, nitride and Si etch.

Herein, an improved resist process is disclosed encompassing a resist on top of a vapor deposited silicon, germanium, boron, tin, iron and titanium containing materials. These materials: (1) have appropriate optical properties at the given wavelength to function as an BARC (2) do not negatively interact with the resist creating residue, a foot, undercut as does the silicon oxy nitride BARC (3) provide improved etch selectivity to resist as compared to conventional BARCs thus allowing a thinner resist to be used than that possible with conventional BARCs and (4) provide excellent etch selectivity to oxide/nitride thus allowing the BARC to also function as a hardmask.

OBJECTS

It is an object of the present invention to provide an improved resist structure.

It is another object of the present invention to provide an improved resist structure formed from a plurality of layers.

It is another object of the present invention to provide a resist structure having a plurality of layers wherein the bottom layer is a tunable layer.

It is another object of the present invention to provide a resist structure having a plurality of layers wherein the bottom layer is a layer whose optical properties and chemical compositions are tuned.

It is another object of the present invention to provide a resist structure having a plurality of layers wherein the bottom layer substantially does not interact with the resist layer.

It is another object of the present invention to propose formation of a bottom planarizing layer by vapor deposition. Vapor deposited films have a vastly increased optical purity and tunability when compared to spin on polymer films commonly used in bilayer and trilayer resist structures.

It is another object of the present invention to provide a resist structure having a plurality of layers wherein the bottom layer substantially does not interact with a chemically amplified resist layer.

It is another object of the present invention to provide a resist structure consisting of a resist on top of a vapor deposited RCHX film wherein R is selected from Si, Ge,B, Sn, Fe, Ti and mixtures of these elements and X is selected from O, N, S, F and mixtures of these elements and X is optionally present.

It is another object of the present invention to provide a resist structure consisting of a resist on top of a vapor deposited RCHX film wherein this film (1) has appropriate optical properties at the appropriate wavelength to function as a BARC (2) does not interact with the resist inducing residue, footing, or undercutting (3) provides good etch selectivity to the resist.

It is another object of the present invention to provide a resist structure consisting of a resist on top of a vapor deposited RCHX film wherein this film (1) has appropriate optical properties at the appropriate wavelength to function as a BARC (2) does not interact with the resist inducing residue, footing, or undercutting (3) provides good etch selectivity to the resist and (4) provides good etch selectivity to the underlying oxide, nitride, and Si layers.

It is another object of the present invention to provide a resist structure consisting of a resist on top of a vapor deposited RCHX film that is applicable to optical lithography (248 nm, 193 nm, 157 nm, 126 nm), extreme ultraviolet lithography (EUV), electron beam (e-beam) lithography, ion beam and x-ray lithography.

It is another object of the present invention to provide a method of depositing by vapor deposition RCHX films where R is selected from Si, Ge,B, Sn, Fe, Ti and mixtures of these elements and X is selected from O, N, S, F and mixtures of these elements and X is optionally present which have the required optical properties at various imaging wavelengths (248, 193, 157, 126 nm and extreme ultraviolet) to function as an ARC. The optical properties of these films—the index of refraction (n) and extinction coefficient (k)—can be tuned by controlled changes in the deposition process.

It is another object of the present invention to provide a method of depositing by vapor deposition RCHX films where R is selected from Si, Ge,B, Sn, Fe, Ti and mixtures of these elements and X is selected from O, N, S, F and mixtures of these elements and X is optionally present wherein this film 1) has appropriate optical properties at the appropriate wavelength to function as a BARC (2) does not interact with the resist inducing residue, footing or undercutting (3) provides good etch selectivity to the resist.

It is another object of the present invention to provide a method of depositing by vapor deposition RCHX films where R is selected from Si, Ge,B, Sn, Fe, Ti and mixtures of these elements and X is selected from O, N, S, F and mixtures of these elements and X is optionally present wherein this film 1) has appropriate optical properties at the appropriate wavelength to function as a BARC (2) does not interact with the resist inducing residue, footing or undercutting (3) provides good etch selectivity to the resist and (4) provides good etch selectivity to the underlying oxide, nitride, and Si layers.

It is another object of the present invention to carry out the depositions by plasma enhanced chemical vapor deposition (PECVD) using methylsilanes, such as trimethylsilane (3MS), tetramethylsilane (TMS), tetramethylcyclotetrasiloxane, or octamethylcyclotetrasiloxane.

It is another object of the present invention to carry out the depositions by plasma enhanced chemical vapor deposition (PECVD) using methylgermanes, such as tetramethylgermane (TMG).

It is another object of the present invention to carry out the depositions by plasma enhanced chemical vapor deposition (PECVD) using mixtures of methylsilanes or methylgermanes with precursors containing oxygen, such as $O_2$, or $N_2O$, precursors containing nitrogen, such as NH3, or precursors containing fluorine, such as $C_6F_6$, or mixtures of such precursors.

It is another object of the present invention to provide a method of depositing by vapor deposition a RCHX films which can be used as a hardmask in subsequent dry etch image transfer to the underlying oxide, nitride or Si substrate.

It is an object of the present invention to provide a resist structure having a plurality of layers wherein the optical properties, chemical properties, and physical properties of the RCHX arc-hardmask are controlled by an appropriately tuned deposition process.

It is an object of the present invention to provide a R:C:H:X hardmask material whose optical, chemical, and physical properties are not significantly affected by exposure to the given irradiation.

SUMMARY OF THE INVENTION

A broad aspect of the present invention is a resist structure comprising of a resist on top of a vapor deposited RCHX film wherein R is selected from Si, Ge, B. Sn, Fe, Ti and mixtures of these elements and X is selected from O, N, S, F, and mixtures of these elements and X is optionally present in the film.

A broad aspect of the present invention is a resist structure comprising a resist on top of a vapor deposited RCHX film wherein R is selected from Si, Ge, B. Sn, Fe, Ti and mixtures of these elements and X is selected from O, N, S, F, and mixtures of these elements and X is optionally present in the film wherein the optical and chemical properties of the RCHX films are tuned to (1) provide suitable optical properties at the appropriate wavelength (248 nm, 193 nm, 157 nm, 126 nm and extreme ultraviolet radiation) to function as an ARC (2) not negatively interact with the resist inducing residue, footing or undercutting and (3) provides good etch selectivity to the resist.

A broad aspect of the present invention is a resist structure comprising of a resist on top of a vapor deposited RCHX film wherein R is selected from Si, Ge, B. Sn, Fe, Ti and mixtures of these elements and X is selected from O, N, S, F, and mixtures of these elements and X is optionally present in the film wherein the optical and chemical properties of the RCHX films are tuned to (1) provide suitable optical properties at the appropriate wavelength (248 nm, 193 nm, 157 nm, 126 nm and extreme ultraviolet radiation) to function as an ARC (2) not negatively interact with the resist inducing residue, footing or undercutting and (3) provide good etch selectivity to the resist and (4) provide good etch selectivity to the underlying oxide, nitride, and Si layer to function as a hardmask.

Another more specific aspect of the present invention is a method of depositing by vapor deposition RCHX films wherein R is selected form Si, Ge, B, Sn, Fe, and Ti and mixtures of these elements and X is selected from O, N, S, F, and mixtures of these elements wherein the optical, chemical, and physical properties of these films are readily tuned by controlled modification of the deposition conditions. The films produced herein have the index of refraction n and extinction coefficient k that can be independently tuned to function as an ARC at 248, 193, 157, 126 nm and extreme ultraviolet radiation.

Another more specific aspect of the present invention is a method of preparing by vapor deposition RCHX films whose index of refraction n and extinction coefficient k of these films can be independently tuned at 248, 193, 157, 126 nm and extreme ultraviolet radiation. More specifically, the index of refraction n and extinction coefficient k can be tuned from about 1.5 to 2.2 and about 0.01 to 0.5 at 248, 193 and 157 nm.

BRIEF DESCRIPTION OF THE DRAWINGS

FIG. 1 (a) shows swing curve of single layer resist with bottom ARC.

FIG. 1 (b) shows swing curve of RCHX ARC-hard mask resist process.

FIG. 2 (a) shows a diagram of a RCHX ARC-hard mask resist structure.

FIG. 2 (b) schematically shows a RCHX (graded) layered ARC-hard mask structure.

FIG. 3 (a) shows a chemical structure of tetramethyl silane precursor.

FIG. 3 (b) shows a chemical structure of trimethyl silane precursor.

FIG. 3 (c) shows a chemical structure of tetramethycyclotetrasiloxane precursor.

FIG. 3 (d) shows a chemical structure of tetramethyl germane precursor.

FIG. 4 (a) shows reflectance at ARC-hardmask/resist interface at 248 nm as a function of ARC thickness for different values of refractive index (n) using a fixed value of k=0.25.

FIG. 4 (b) shows reflectance at ARC-hardmask/resist interface at 248 nm as a function of ARC thickness for different values of extinction coefficient (k) using a fixed value of n=1.75.

FIG. 5 (a) shows the measured reflectance and the calculated reflectance (from 900 to 190 nm) of R:C:H:X material about 4500Å thick as described in example 2. FIG. 5 (b) shows the corresponding n and k values as a function of wavelength

DETAILED DESCRIPTION

Typical resist structures consist of a resist on top of an antireflective coating ARC. The resist is exposed and developed and the image is then transferred through the ARC and then through the underlying oxide, nitride or silicon layers. Typical resist thickness is on the order of 5000Å for the current state-of-the-art lithography process. During the ARC open, significant resist is lost as the etch selectivity between the resist and ARC is at best 1:1. As minimum features continues to decrease, it is desirable to thin the resist to attain the high resolution as well as improved process window (exposure and focus latitude). However, thinning the resist below 5000Å poses etch problems. There will be insufficient resist to function as a etch mask for subsequent transfer etch into the oxide, nitride or Si layer. Compounding this problem is the fact that significant resist loss also occurs during the ARC open. To circumvent this problem, herein we disclose an improved resist structure consisting of a resist on top an improved vapor deposited ARC. This ARC provides significantly better etch selectivity to resist (>1:1), does not interact with the resist in a negative fashion inducing footing, undercutting or residue as is characteristic of silicon oxy nitride ARC. In addition the optical properties of the vapor deposited ARC can be tuned by variations in the deposition process. Furthermore, the optical properties can also be tuned within the film thickness thereby forming a graded ARC. Lastly, the vapor deposited ARC can also function as a hardmask as it provides good etch selectivity to oxide, nitride and Si for etch transfer into the oxide, nitride and Si. Because of the improved etch selectivity to resist, it is now possible to thin the resist to below 5000Å. It is also possible for the vapor deposited material to function as a combined ARC-hardmask.

The materials that are useful to practice the present invention have composition R:C:H:X wherein R is selected from Si, Ge, B, Sn, Fe, Ti and mixtures of these elements and X is selected from O, N, S, F and mixtures of these elements and X is optionally present.

Figure 2A:
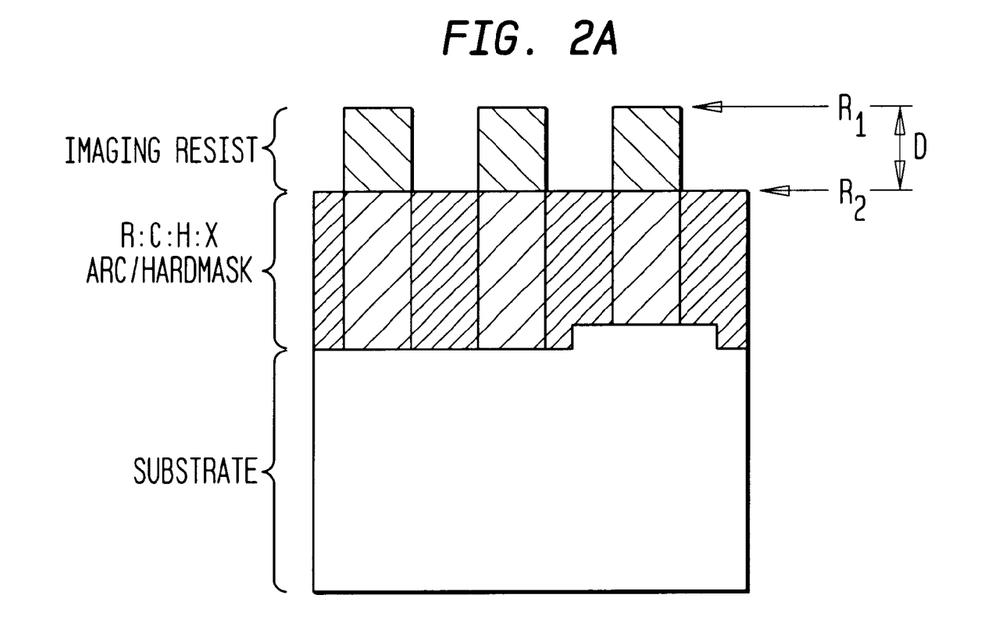
Figure 2B:
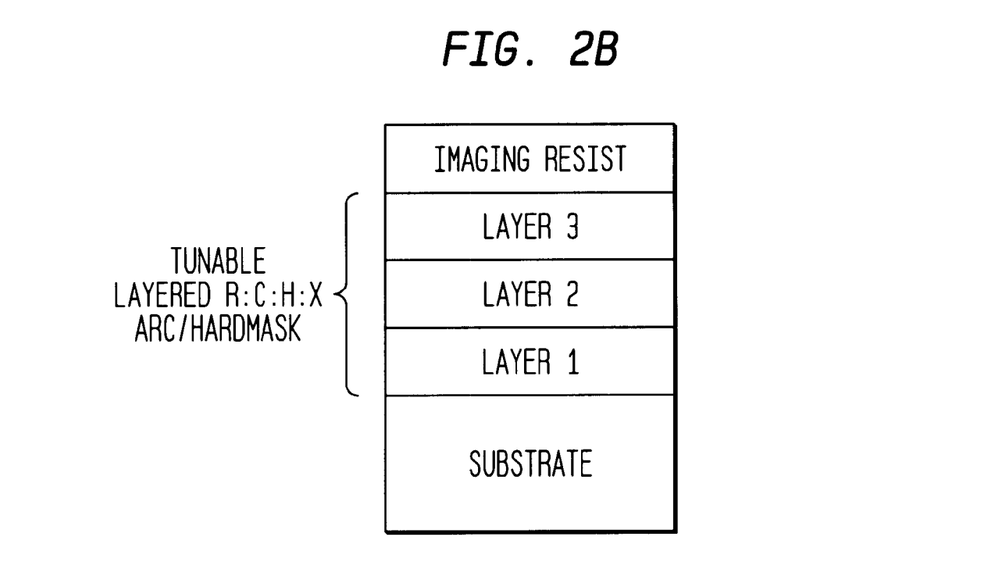
Figure 3A:
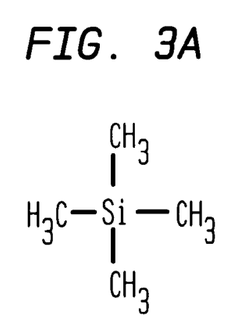
Figure 3B:
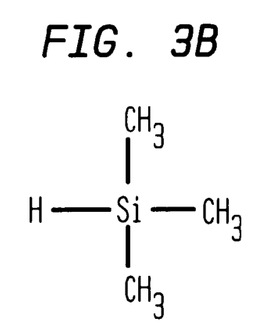
Figure 3C:
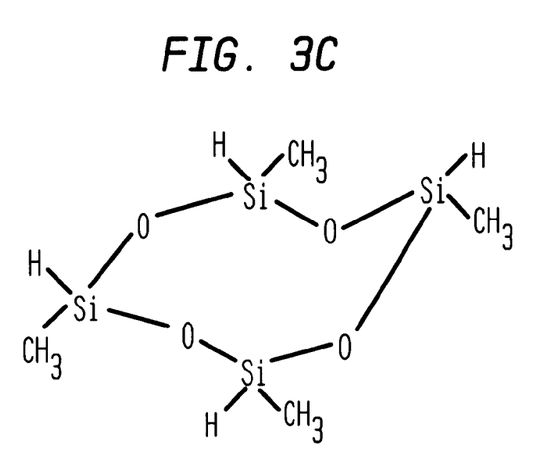
Figure 3D:
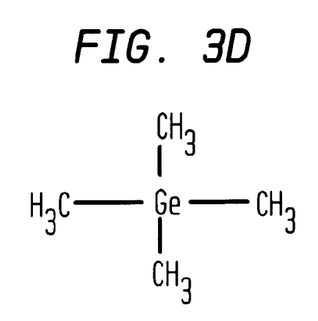

The resist/RCHX structure is depicted in FIG. 2a. FIG. 2b schematically shows the structure of a graded or tunable layered RCHX resist structure. In this case, the optical properties of the RCHX film are tuned within the thickness of the film. The layered ARC-hard mask structure is produced by a vapor deposition method using appropriate Si, Ge, B, Sn, Fe, and Ti precursors by adjusting process parameters and/or precursor composition. In the case of Si:C:H:X films, these are deposited from methylsilanes with/without additions of nitrogen and/or oxygen and/or fluorine containing precursors.

The preferred atomic % ranges for R are the following: preferably 0.0% atomic % to 95%, more preferably 0.5% atomic % to 95%, most preferably 1 to 60% and most highly preferably 5 to 50%.

The preferred atomic % ranges for C are the following: preferably 0.0% atomic % to 95%, more preferably 0.5% atomic % to 95%, most preferably 1 to 60% and most highly preferably 5 to 50%.

The preferred atomic % ranges for H are the following: preferably 0% atomic % to 50%, more preferably 0.5% atomic % to 50%, most preferably 1 to 40% and most highly preferably 5 to 30%.

The preferred atomic % ranges for O are the following: preferably 0% atomic % to 70%, more preferably 0.5% atomic % to 70%, most preferably 1 to 40% and most highly preferably 5 to 30%.

The RCHX film produced by the present invention has a tunable index of refraction and extinction coefficient which can be optionally graded along the film thickness to match the optical properties of the substrate and the imaging resist. The optical properties at DUV and the lithographic features of the film produced by the present invention are vastly superior to those obtained by other hardmask materials such as oxide type materials (TEOS, BSG) and nitride type materials (H. C. Lee, J.Vac.Sci.Technol., vol.16, No.5, p.2763, 1998, J. F. Rembetski, Solid State Technol. Vol.38, No.3, p67, 1995) Thus, a Si Substrate coated with the thick planarizing—ARC-hard mask R:C:H:X material of this invention drastically reduce thin film interference and substrate reflectivity at 248, 193 and 157 nm, which consequently improves CD control. The Si:C:H:X materials are described by A. Grill et al. in HYDROGENATED OXIDIZED SILICON CARBON MATERIAL, filed in U.S as U.S. application Ser. No. 09/107,567 filed on Jun. 29, 1998,now issued as U.S. Pat. No. 6,147,009, the teaching of which is incorporated herein by reference.

The films of the present invention can be deposited by plasma enhanced chemical vapor deposition (PECVD) techniques. In one type of technique the PECVD process is performed in a parallel plate reactor where the substrate is placed on one of the electrodes. In the following embodiment examples the substrate is placed on the powered electrode of a parallel plate PECVD reactor, therefore acquiring a negative bias.

The following are a list of non-limiting exemplary embodiments:

In one embodiment a SiCH film is deposited under the following conditions:

precursor=tetramethylsilane at a flow of 10 sccm pressure in reactor=200 mtorr substrate temperature=60° C.

substrate bias=−200 V

In a second embodiment a SiCOH film is deposited under the following conditions:

precursor=tetramethylsilane at a flow of 10 sccm mixed with oxygen at a flow of 2 sccm pressure in reactor=200 mtorr
substrate temperature=180° C.
substrate bias=−200 V
In a third embodiment a SiCH film is deposited under the following conditions:
precursor=trimethylsilane at a flow of 10 sccm
pressure in reactor=200 mtorr
substrate temperature=60° C.
substrate bias=−200 V
In a fourth embodiment a SiCOH film is deposited under the following conditions:
precursor=trimethylsilane at a flow of 10 sccm mixed with oxygen at a flow of 2 scom
pressure in reactor=200 mtorr
substrate temperature=60° C.
substrate bias=−200 V
In a fifth embodiment a siO COH film is deposited under the following conditions:
precursor=tetramethyltetrasiloxane with argon as a carrier gas at flow of 30 sccm
pressure in reactor=250 mtorr
substrate temperature=60° C.
substrate bias=−150 V
In a SIXTH embodiment a SiCOH film is deposited under the following conditions:
precursor=tetramethyltetrasiloxane with argon as a carrier gas at flow of 30 sccm
pressure in reactor=250 mtorr
substrate temperature=180° C.
substrate bias=−200 V
In a SEVENTH embodiment a siCOH film is deposited under the following conditions:
precursor=tetramethyltetrasiloxane with argon as a carrier gas at flow of 30 sccm
pressure in reactor=200 mtorr
substrate temperature=180° C.
substrate bias=−200 V
In a EIGHTH embodiment a GeCH film is deposited under the following conditions:
precursor=tetramethylgermane with argon as a carrier gas at flow of 30 sccm
pressure in reactor=50 mtorr
substrate temperature=180° C.
substrate bias=−250 V
In a NINTH embodiment a GeCH film is deposited under the following conditions:
precursor=tetramethylgermane with argon as a carrier gas at flow of 30 sccm
pressure in reactor=100 mtorr
substrate temperature=60° C.
substrate bias=−50 V
In a TENTH embodiment a GeCHO film is deposited under the following conditions:
precursor=tetramethylgermane at a flow of 15 sccm mixed with oxygen at a flow of 2 sccm
pressure in reactor=200 mtorr
substrate temperature=60° C.
substrate bias=−50 V The R:C:O:X films can be deposited also in a parallel plate PECVD reactor with the substrate positioned on the grounded electrode. It can be deposited in conditions similar to those described in the previous examples but at substrate temperatures up to 400° C., and in high density plasma type reactors under suitable chosen conditions.

It should be noted that by changing process parameters such as bias voltage, gas flow, pressure and deposition temperature, the film optical constants can be changed. In addition, the composition of the starting precursor as well as the introduction of oxygen, nitrogen, fluorine containing precursors also allows the tunability of these films. The film optical constants are defined here as the index of refraction n and the extinction coefficient k. In general, ARC-hard mask and resist systems can be modeled so as to find optimum optical parameters (n and k values) of ARC-hard mask layer as well as optimum thickness. To achieve this, a knowledge of the optical constants of the entire film structure is necessary in order to compute the minimal reflectance at ARC-hard mask and resist interface. Computations are based on algorithms which use the Fresnel coefficients as found in standard textbooks such as Optics, by E. Hecht and A. Zajac, published in 1979 by Wiley, pages 312 and 313. The preferred optical constants

| Film Composition | $n_{248nm}$ | $k_{248nm}$ | $n_{193nm}$ | $k_{193nm}$ |
|---|---|---|---|---|
| Si:C:O:H | 1.936 | 0.104 | 2.005 | 0.332 |
| Si:C:O:H | 1.725 | 0.158 | 1.670 | 0.189 |
| Si:C:H | 1.793 | 0.081 | 1.853 | 0.288 |
| Si:C:H | 1.993 | 0.212 | 1.926 | 0.536 |
| Si:C:H | 1.958 | 0.456 | 2.004 | 0.646 |
| Si:C:H | 2.261 | 0.323 | 2.236 | 0.512 |
| Si:C:O:H | 1.847 | 0.186 | 1.750 | 0.456 |
| Si:C:O:H | 1.987 | 0.217 | 1.936 | 0.316 |
| Si:C:H | 2.056 | 0.567 | 2.133 | 0.785 |
| Ge:C:H | 2.532 | 0.562 | 2.452 | 0.571 |
| Ge:C:H | 1.816 | 0.233 | 1.734 | 0.519 |
| Ge:C:H:O | 1.658 | 0.005 | 1.895 | 0.101 | of the RCHX films prepared by the present process are in the range from about n=1.4 to n=2.6 and k=0.01 to k=0.78 at a wavelength of 248, 193 and 157 nm, 126 nm and extreme ultraviolet radiation. The optimum ARC-hard mask thickness varies between 350 to 50000 Å depending on film absorption. More commonly, the k values were between 0.15 and 0.6 at DUV for a 10× reduction in swing ratio. The index of refraction n vary between 1.5 to 2.3

A fundamental disadvantage of the previously described silicon nitride and silicon oxynitrides (SiON) materials which also can be used as an ARC/Hardmask layers is the severe resist poisoning which significantly limits the resist resolution (Y. Trouiller Microelectron. Eng. Vol. 46, No. 1–4 1998 pp. 47–50) Various surface treatments can be used to prevent the poisoning of the resist but they have disadvantages such as variation of optical properties of SiON films after the surface treatment and poor controllability. RCHX films do not interact with the resist and good resolution down to 125 nm was obtain using RCHX films as an ARC layers. Moreover, Silicon nitride and silicon oxynitrides are typically etched with fluorocarbon and oxygen mixtures where their etch selectivity with respect to photoresist is ~1 (Sato et al., J. Vac. Sci. Technol. B 16(3), 1998, p1038–42). This translates into excessive photoresist loss and photoresist profile degradation going into subsequent etch steps when compared to the deposited polysilane case. Moreover, silicon nitride and silicon oxynitrides cannot be used to pattern pad nitride substrates because of their compositional similarity.

RCHX films have good etch selectivity to a conventional deep UV photoresist. Etch selectivities of 1.5–4 to 1 of RCHX films to resist ware obtain using a halogen or/and fluorocarbon-based chemistry in conjunction with a high-density plasma etcher. This will prevent the excessive photoresist loss observed in conventional ARC-open etches and allow thin resist process.

RCHX films also have excellent etch resistance to fluorocarbon plasmas used to etch silicon oxide and silicon nitride. The blanket etch rates measured for the RCHX film and silicon oxide indicate etch selectivities of ~7 and ~13, respectively. The blanket etch rates measured for the RCHX film and silicon nitride indicate an etch selectivity greater than 4. This suggests that the RCHX martial possess excellent hard mask characteristics for subsequent silicon oxide and silicon nitride etches.

The optical, chemical, and physical properties of the RCHX films of the present invention are not significantly affected by exposure to the given irradiation. In particular, no significant bond scissions is observed nor incorporation of oxygen in the film composition under irradiation at 248 nm-126 nm.

The following examples are given to illustrate the scope of the present invention. Because these examples are given for illustrative purposes only, the invention embodied therein should not be limited thereto.

EXAMPLE 1

Figure 4A:
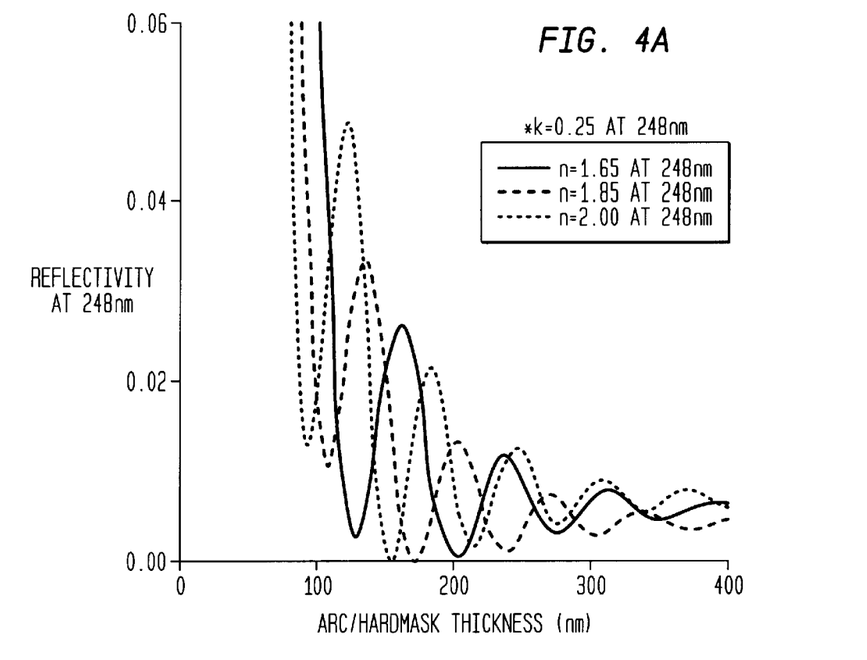
Figure 4B:
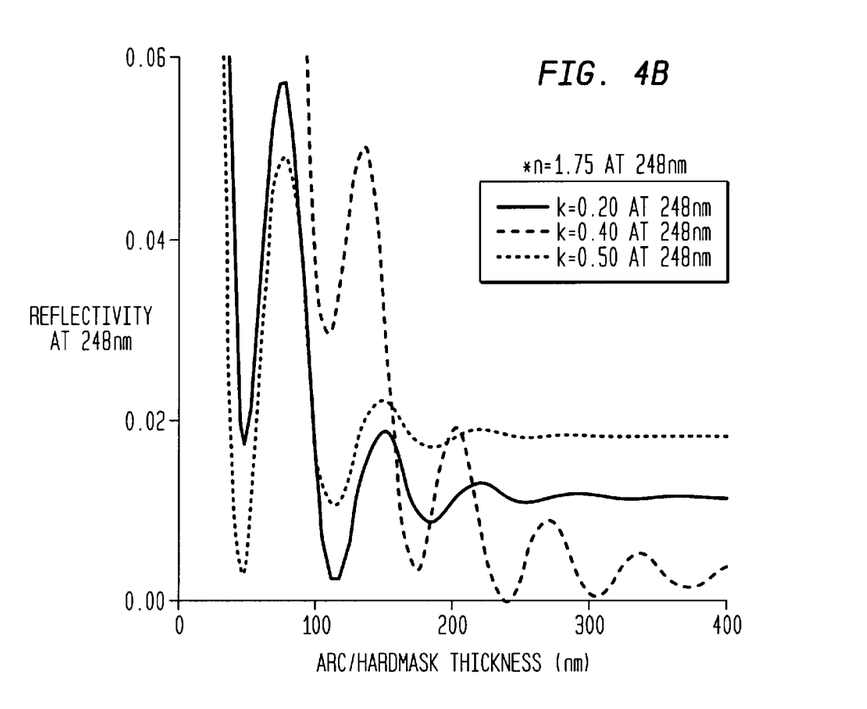

The following example illustrates calculations for obtaining optimum optical constants and thickness of RCHX film to be used as an ARC/Hardmask layer. Parameters are optimized so as to reduce reflections at the ARC/resist interface. Computations are based on algorithms which use the Fresnel coefficients as found in standard textbooks such as Optics, by E. Hecht and A. Zajac, published in 1979 by Wiley, pages 312 and 313. These simulations can be extended to many different structures and they are not limited by the examples given below. The structure simulated in this example includes a Si substrate, RCHX ARC-hard mask layer and photoresist. The parameters under investigation are the ARC-hard mask layer optical constants n and k and film thickness d. The imaging resist index of refraction extinction coefficient k and film thickness are fixed and given by n=1.78, k=0.018 at 248 nm. FIG. 4a shows reflectivity at the ARC/resist interface at 248 nm as a function of ARC thickness for different values of refractive index (n) using a fixed value of k=0.25. The structure simulated includes a Si substrate, ARC-hard mask film layer and photoresist. These simulations show that there is no significant variation in reflectance as a function of refractive index. For instance, if 3000A of a RCHX ARC-hard mask film with 1.65<n<2.0 at 248 nm is chosen, a significant reflectivity reduction (about 0.01) can be achieved. FIG. 4b shows reflectivity at the ARC/resist interface at 248 nm as a function of ARC thickness, where k of the ARC film varies but n is fixed at 1.75. The simulated layered structure is similar to the one described above. In this case, by increasing the extinction coefficient higher values of reflectance are obtained; the extinction coefficient has a stronger impact on reflectance than does the index of refraction.

An ARC material with k value of ~0.2 or slightly below is desirable. The optimum optical properties of the R:C:H:X ARC-hardmask material are an index of refraction in a range from 1.65 to 2.0 and an extinction coefficient from about 0.18 to about 0.22 at 248 nm. Thus, by using an ARC-hard mask layer 3000A or thicker, a significant reflectivity reduction (less then 0.01) can be achieved at the ARC/resist interface.

EXAMPLE 2

The following example illustrates how to measure the optical constants n and k of the ARC-hard mask materials. This measurement technique can be applied to a variety of different processes and it is not limited by the two example above.

The optical constants were measured using an n&k Analyzer manufactured by n&k Technology, S. Clara, Calif. A description of this instrument and its operation can be found in U.S. Pat. No. 4,905,170, 1990, the teaching of which is incorporated herein by reference. They use a method based on broadband spectrophotometry and equations for optical constants derived by Forouhi and Bloomer (Phys. Rev. B, 38, pp. 1865–1874, 1988). Their analysis is based on a physical model for the refractive index, n, and extinction coefficient, k, applicable to a wide range of semiconductor and dielectric films, and valid over the deep ultraviolet—near infrared wavelength range. The $n(\lambda)$ and $k(\lambda)$ ($\lambda$ is the wavelength) spectra of any material cannot be measured directly but they are determined from a de-convolution of a reflectance measurements $R(\lambda)$. This measurable quantity depends on film thickness, optical constants of the films and substrate. The "n&k Method" provides an accurate, rapid, and nondestructive way to uncouple a reflectance measurement. Algorithms can be generated that compare the theoretical reflectance with the measured one. From this comparison film thickness, $n(\lambda)$ and $k(\lambda)$ spectra can be determined.

Figure 5:
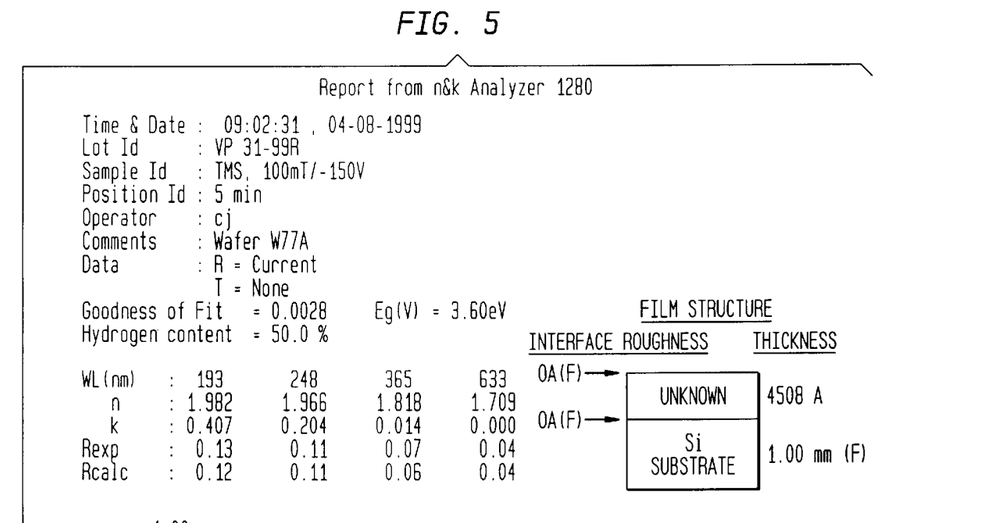
Figure 5A:
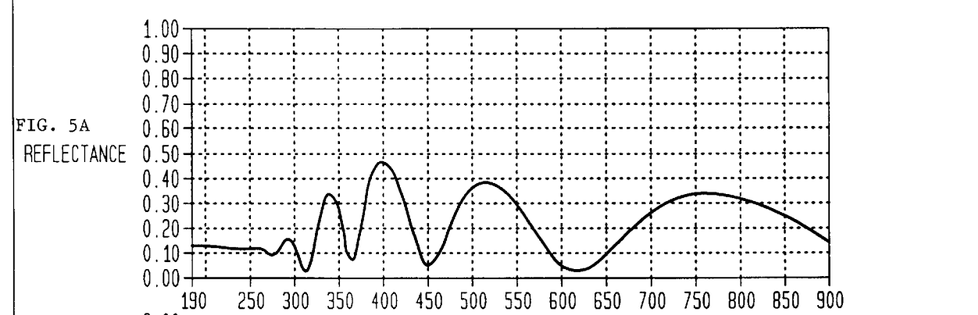

FIGS. 5(a) show the reflectance spectra (from 900 to 190 nm) measured by the n&k Analyzer of R:C:H:X material. The corresponding n and k values are plotted in FIGS. 5(b). The analyzed film is about 4500 A thick.

Figure 5B:
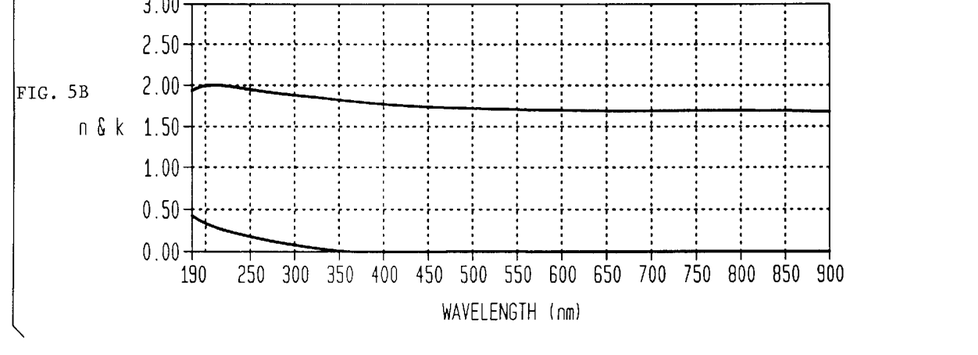

For these particular examples n varies from ~1.84 to ~1.85 and k from ~0.15 to ~0.22 at 248 nm which is compatible with the reflectance analysis of example 1.

EXAMPLE 3

This example illustrates how to form layered (graded) RCHX films to achieve a significant reduction in reflectivity at ARC/resist interface. wider process window with a very low swing ration can be obtain by tuning the optical properties of a RCHX hardmask layer. In a layered hardmask structure (FIG. 2b), the index of refraction (n) and the extinction coefficient (k) are graded through out the hardmask layer thickness to match the adjacent layers, if n and k of the hardmask layer are perfectly match to the adjacent layers, in principle, there should be no reflection at hardmask/resist interface. Graded optical constants of RCHX films were achieved by varying the precursor's composition, deposition conditions as well by doping films with different additives as described in the embodiments above. Table 1 shows the optical constants of different R:C:H:X materials. The index of refraction of RCHX films was varied from about 1.6 to about 2.3 and the extinction coefficient from about 0.01 to 0.5 at 248 nm that enables layered (graded) ARC/Hardmask structure.

Figure 6:
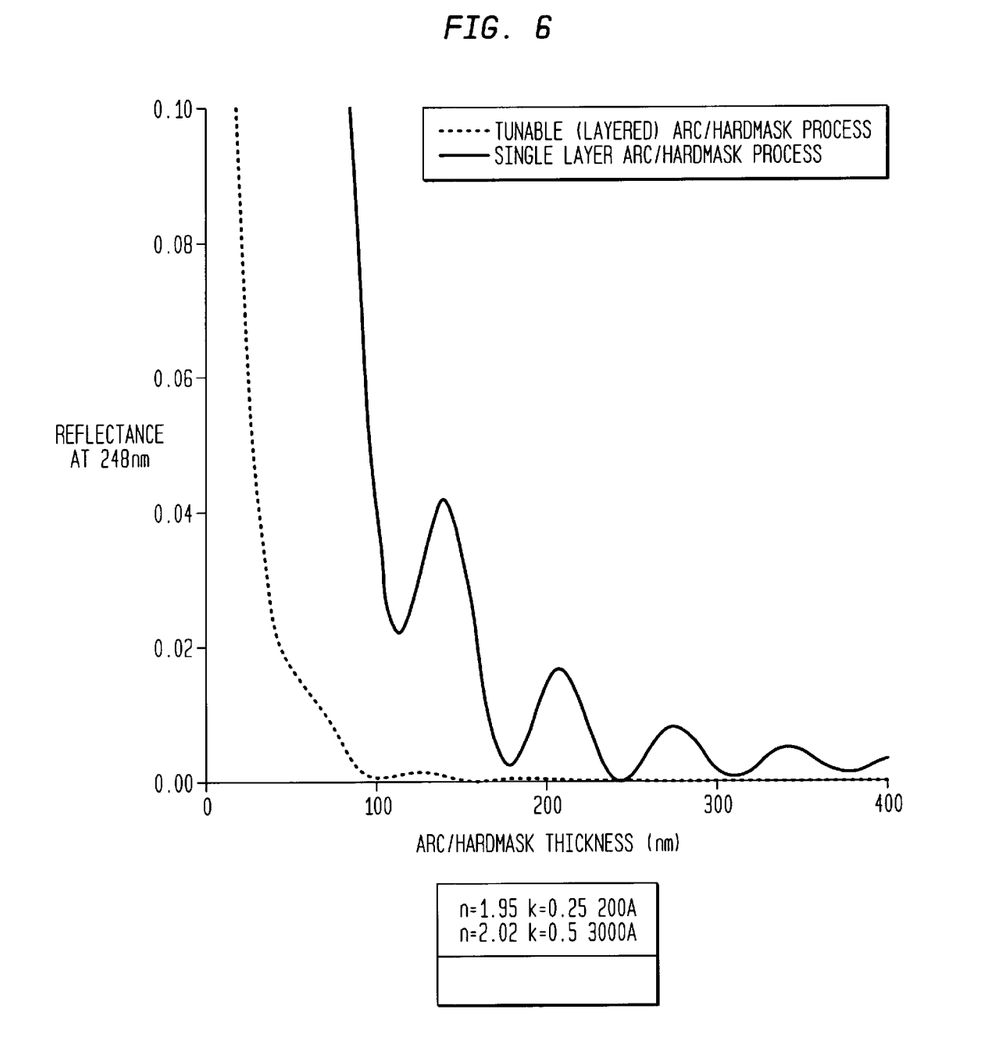
FIG. 6 shows reflectance at ARC-hardmask/resist interface at 248 nm as a function of ARC thickness for single layer ARC(solid line) and for graded (layered) RCHX ARC (dotted line)

We consider the example that compares a conventional single layer ARC structure currently used for patterning with a layered (graded) ARC/Hardmask structure. In this example, first, a 3000A thick film with n=2.1 and k=0.5 is deposited onto Si substrate using process conditions as described in the seventh embodiment and then, a 200A thick film with n=1.9 and k=0.25 is deposited using a process condition as described in the third embodiment. FIG. 6 represents a reflectance at the ARC/resist interface of single layer RCHX film with n=1.75 and k=0.21 at 248 nm (FIG. 6 solid line) and a graded (layered) RCHX film with n and k values described above. (FIG. 6 dotted line). A significant reflectivity reduction (about 0.001) as well insensitivity to hardmask thickness variation can be achieved by using tunable (layered) hardmask process. Since the reflectance of Si at 248 nm is about 0.7 then a swing reduction $\sqrt{0.7/0.001}=26$ is obtain. Moreover, total independence from ARC thickness variation can be achieved by using layered (graded) ARC/Hardmask structure.

EXAMPLE 4

Figure 7:
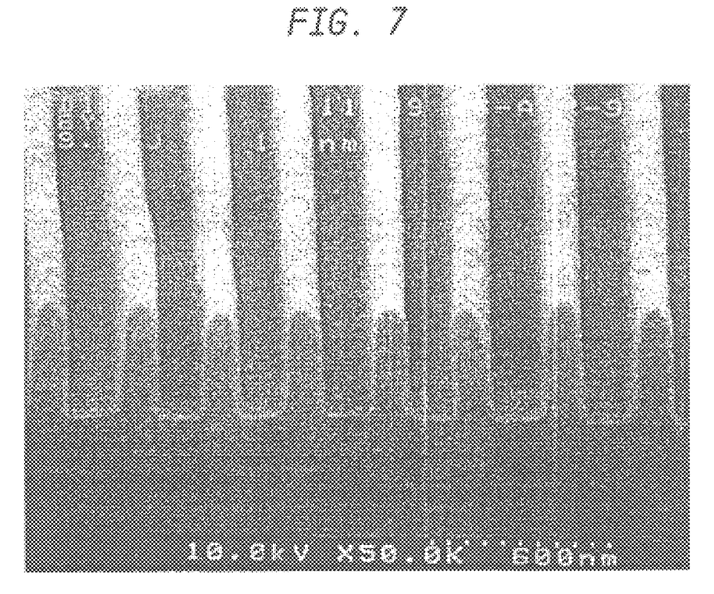
FIG. 7 shows cross-sectional SEM pictures of 150 nm L/S developed resist profiles on a PECVD deposited tetramethylsilane ARC-hardmask layer

The following example is given to demonstrate the performance of RCHX films as an ARC-hard mask layer for advanced resist process. The following example also demonstrates the formation of device features of 0.2 $\mu$m and below using a R:C:H:X vapor deposited ARC-hard mask material. RCHX film was deposited as described in the embodiment above onto 8" wafer. A DUV resist described was spun on a top of the RCHX film and post-apply baked. Then resist is exposed to a 248 nm radiation at a dose of about 48 mJ/cm2 using ASML microstepper and post-exposed baked. Then resist is developed in LDD26W Shipley developer. FIG. 7 shows cross-sectional SEM image of 150 nm L/S developed DUV resist profiles on a PECVD deposited tetramethylsilane film and shows no residue at the resist/RCHX film interface. A DUV resist is about 3400A and RCHX (TMS) film thickness is about 2400A.

EXAMPLE5

Figure 8:
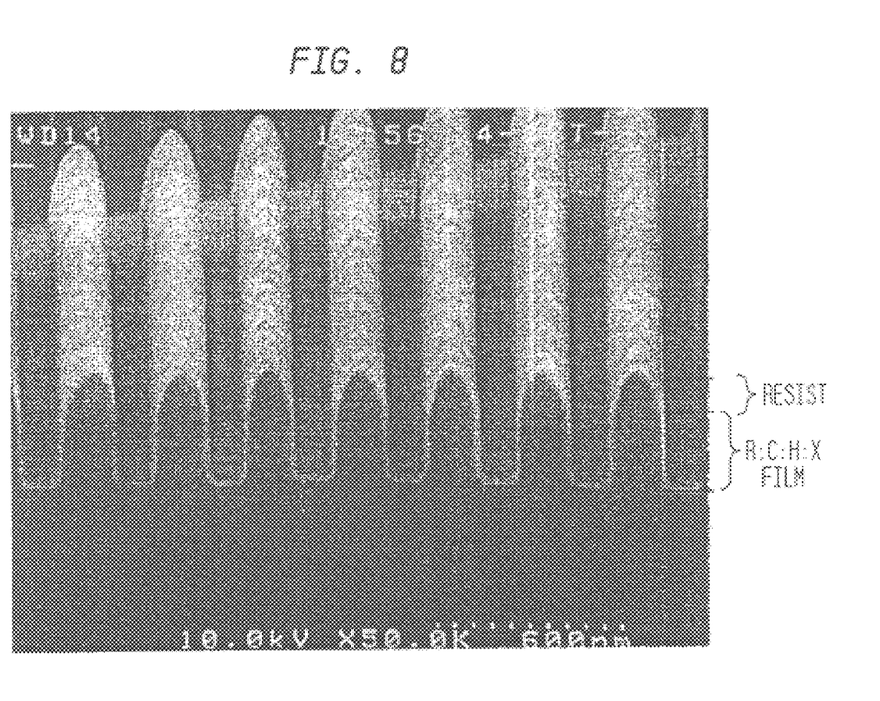
FIG. 8 shows cross-sectional SEM pictures of 150 nm L/S profiles of etch RCHX film using resist as an etch

This example illustrates the ability to pattern the R:C:H:X material with a conventional deep UV photoresist mask using plasma etching. As can be seen in FIG. 8, a halogen or/and fluorocarbon-based chemistry was used in a high-density plasma etcher to delineate 150 nm line-and-space features in a 240 nm thick RCHX film with excellent anisotropy and adequate selectivity of 1.2 with respect to the photoresist. Blanket etch selectivities in excess of 4 with respect to photoresist were observed with less aggressive plasma etches.

Owing to the vertical profiles obtainable with minimal etch bias and the excellent etch resistance to common substrate materials such as silicon oxide and silicon nitride (as described in the example 6), the R:C:H:X material is an excellent candidate for hard mask.

EXAMPLE 6

This example shows the excellent etch resistance of the R:C:H:X material to fluorocarbon plasmas used to etch silicon oxide and silicon nitride. The blanket etch rates measured for the RCHX film and silicon oxide for two different plasma chemistries which are summarized in FIG. 9 indicate etch selectivities of ~7 and ~13, respectively. The blanket etch rates measured for the RCHX film and silicon nitride and shown in FIG. 9 indicate an etch selectivity greater than 4. This data suggests that the R:C:H:X material possess excellent hard mask characteristics for subsequent etches.

EXAMPLE 7

Figure 10:
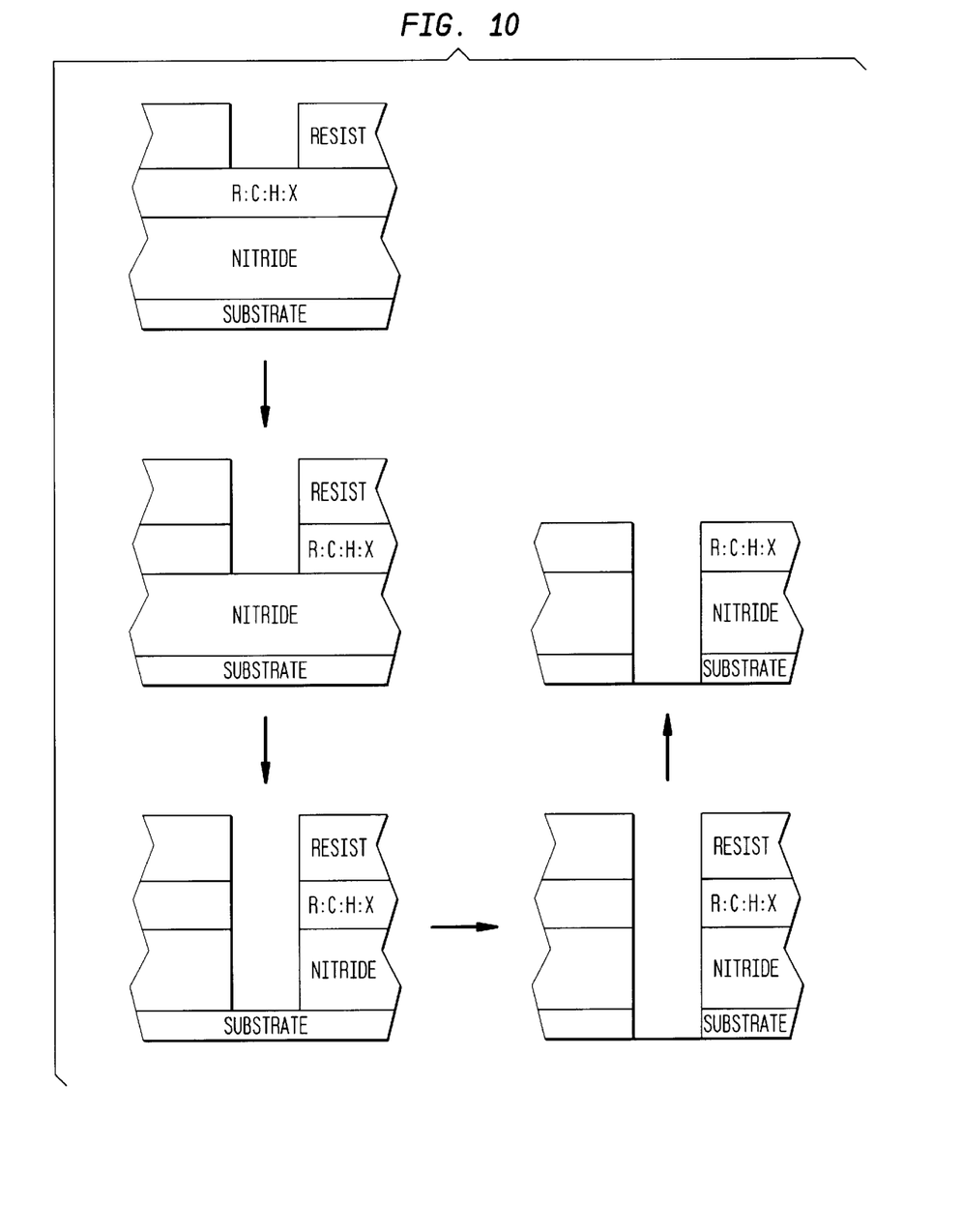
FIG. 10 shows process integration scheme using the RCHX film that reduces the need of one material and one process step.

The following example explains an integration scheme using the deposited RCHX film which reduces the need of one material and one process step. The RCHX film in this case replaces the BARC and oxide hardmask layers thus performing the role of a combined ARC and hardmask for the subsequent nitride etch step. The photoresist patterns are reproducibly transferred into the deposited RCHX film using a $Cl_2$ chemistry on a high-density plasma etcher. This is enabled by the reasonably selective and highly anisotropic nature of the etch (FIG. 8). The blanket RCHX film to photoresist selectivity of ~2 is superior to the conventional BARC to photoresist selectivities of ~1. This means that compared to the conventional process sequence, more photoresist remains intact going into the next etch step. The pattern is then transferred into the nitride with a fluorocarbon-based plasma since the nitride to deposited RCHX film selectivity is reasonably high. The entire process sequence is summarized in FIG. 10.

EXAMPLE 8

Figure 9A:
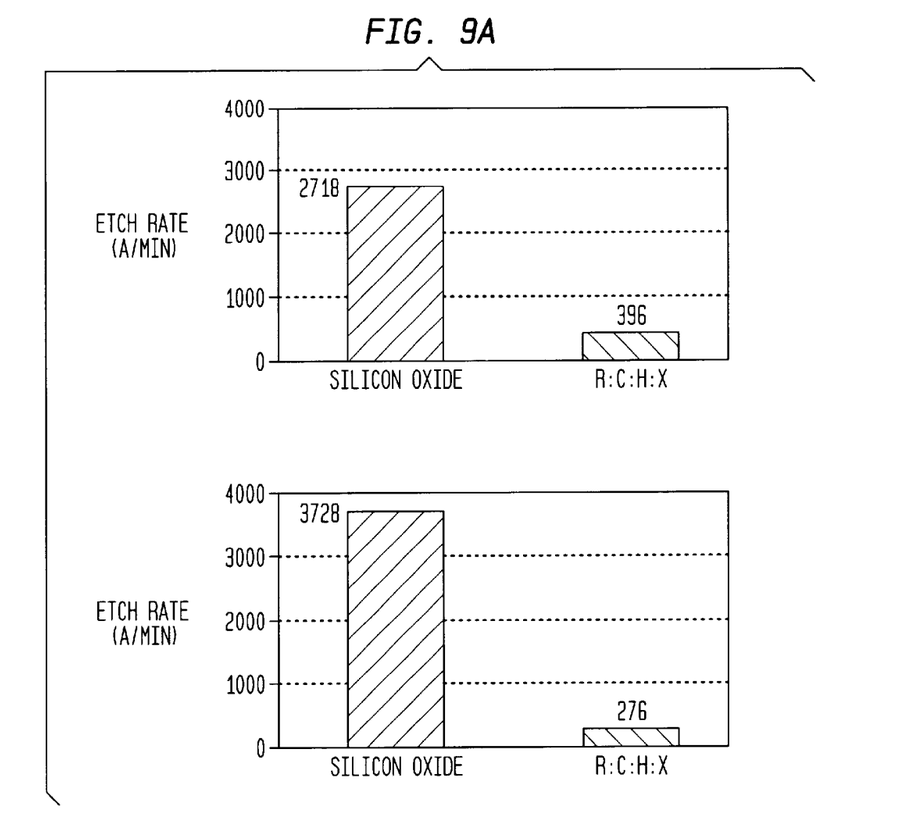
FIG. 9 shows etch rates of RCHX film and resist
Figure 9B:
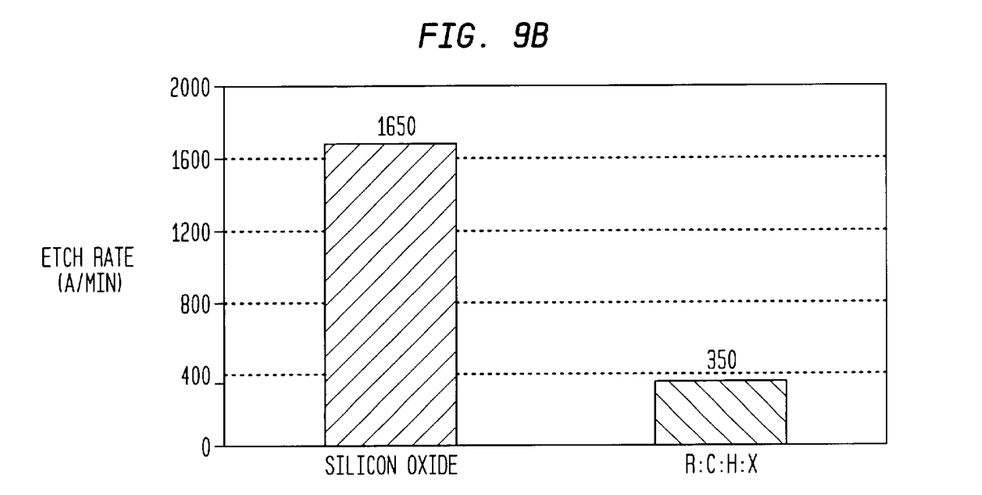
Figure 11:
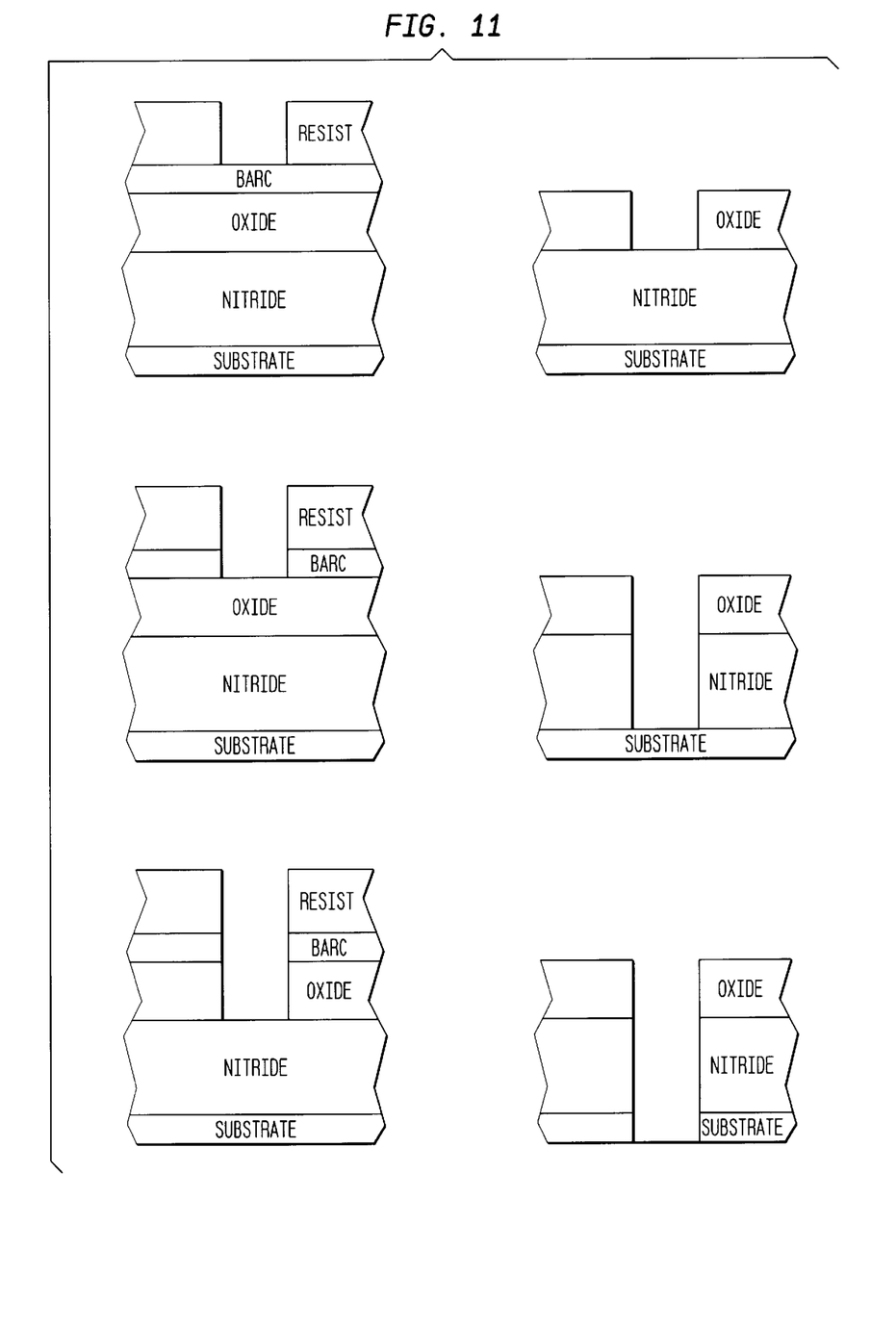
FIG. 11 shows process integration scheme using the RCHX film as a replacement to conventional bottom ARC in a conventional stack

This example shows the use of the deposited RCHX film as a replacement to conventional bottom ARC in a conventional stack. The process flow is summarized in FIG. 11. The photoresist patterns are transferred into the deposited RCHX film using a $Cl_2$ plasma etch after which the photoresist is ashed. The RCHX feature is transferred into the oxide layer with a fluorocarbon plasma; the low etch rate of the RCHX compared to that of oxygen makes this pattern transfer possible. This inherent selectivity for two different fluorocarbon plasmas is shown in FIG. 9. The remaining process flow is similar to the conventional process flow shown in FIG. 11. When using the RCHX as an ARC, less aggressive etching conditions leading to higher etch selectivities with respect to photoresist can be used because the film will be only ~90 nm thick. This will prevent the excessive photoresist loss observed in conventional ARC-open etches.

While the films in the examples above were prepared by plasma enhanced chemical vapor deposition (PECVD), similar films can be prepared by any radiation assisted technique. Such radiation assisted techniques include PECVD, high density plasma (HDP), sputtering, ion beam, electron beam, and laser assisted techniques.

While this invention has been described in terms of certain embodiment thereof, it is not intended that it be limited to the above description, but rather only to the extent set forth in the following claims. The embodiments of the invention in which an exclusive property or privilege is claimed are defined in the appended claims. The teaching of all references cited herein, are incorporated herein by reference.

What is claimed is:

1. A method comprising:
   depositing on a surface of a substrate a plurality of layers at least one of which is an RCHX layer which comprises structural formula R:C:H:X wherein R is selected from the group consisting of Si, Ge, B, Sn, Fe, Ti and combinations thereof and wherein X is not present or is selected form the group consisting of O, N, S and F, a top layer of said plurality of layers is an energy active material.

2. A method according to claim 1 wherein the RCHX layer is vapor deposited.

3. A method according to claim 1 wherein the RCHX layer is deposited by radiation assisted techniques selected from the group comprising chemical vapor deposition, high density plasma, sputtering, ion beam, electron beam, and laser assisted techniques.

4. A method according to claim 3 wherein the RCHX layer is deposited by PECVD from a precursor consisting of at least one of the species from the group comprising of silane, alkylsilanes, arylsilanes, germane, alkylgermanes, arylgermanes, cyclicgermanes, and precursors containing Si—O and Ge—O bonds and mixtures thereof.

5. A method according to claim 4 wherein the precursor is tetramethylsilane.

6. A method according to claim 4 wherein the precursor is tetramethylgermane.

7. A method according to claim 3 wherein the RCHX layer is deposited from a precursor mixture further including at least one of oxygen, nitrogen oxides, nitrogen, fluorine, sulfur, and hydrogen.

8. A method according to claim 3 wherein said RCHX layer is SiCH and is deposited from tetramethylsilane at a flow rate of about 10 sccm in a reactor at pressure of about 200 mtorr wherein said substrate is at a temperature of about 60°C. and said substrate is at a bias of about −200 V.

9. A method according to claim 3, wherein said RCHX layer is a SiCHO layer deposited from tetramethylsilane at a flow rate of about 10 sccm with oxygen at a flow rate of about 2 sccm in a reactor at a reactor at pressure of about 200 mtorr, wherein said substrate is at a temperature of about 180° C. and said substrate is a bias of about −®V.

10. A method according to claim 3 wherein said RCHX layer is GeCH and is deposited from tetramethylgermane at a flow rate of about 10 sccm 5 in a reactor at pressure of about 150 mtorr wherein said substrate is at a temperature of about α° C. and said substrate is at a bias of about −250 V.

11. A method according to claim 1, further including etching a pattern in said plurality of layers.

12. A method according to claim 11, wherein said pattern is formed by first forming a pattern in said energy active layer and thereafter transferring said pattern in to the remains of said plurality of layers using said pattern in said energy active layer as a mask.

13. A method according to claim 1 wherein said RCHX layer does not substantially intermix with said energy active layer.

14. A method according to claim 1 wherein said RCHX layer functions as an antireflective coating, a hardmask, and as a combined antireflective coating/hardmask.

15. A method according to claim 1, wherein said hardmask/antireflective coating is a bottom layer which is overcoated with a layer of energy active material.

16. A method according to claim 1, wherein there is about 0.01 reflectance at the interface of said energy active material and said bottom hardmask/antireflective layer.

17. A method according to claim 1, wherein said energy active material is selected from a group consisting of compositions which are sensitive at 248 nm, 193 nm, 157 nm, 126 nm, and extreme ultraviolet radiation, electron beam, x-ray, and ion beam irradiation.

18. A method according to claim 1, wherein said RCHX layer has an index of refraction from about 1.4 to about 2.6 and an extinction coefficient from about 0.01 to about 0.78 at 248 nm, 193 nm, 157 nm, 126 nm, and extreme ultraviolet radiation.

19. A method according to claim 1, wherein an index of refraction and an extinction coefficient of said RCHX layer are finely tuned to substantially match those of said energy active material and said substrate at a first interface between said RCHX layer and said substrate and at a second interface between said RCHX layer and said energy active material.

20. A method according to claim 1, further including forming a pattern in said energy active layer and developing said pattern.

21. A method according to claim 20, wherein said developed pattern is transferred into said RCHX layer by reactive ion etching in a plasma comprising of at least one of the group of oxygen, fluorine, chlorine, bromine, hydrogen, and mixtures thereof.

* * * * *